United States Patent [19]

Kobatake

[11] Patent Number: 4,937,787
[45] Date of Patent: Jun. 26, 1990

[54] PROGRAMMABLE READ ONLY MEMORY WITH MEANS FOR DISCHARGING BIT LINE BEFORE PROGRAM VERIFYING OPERATION

[75] Inventor: Hiroyuki Kobatake, Tokyo, Japan

[73] Assignee: NEC Corporation, Tokyo, Japan

[21] Appl. No.: 212,376

[22] Filed: Jun. 27, 1988

[30] Foreign Application Priority Data

Jun. 30, 1987 [JP]  Japan ................................ 62-164459

[51] Int. Cl.$^5$ ...................... G11C 7/00; G11C 11/42
[52] U.S. Cl. .................................... 365/94; 365/104;
365/185; 365/201; 365/189.03; 365/194;
365/203; 371/21.1
[58] Field of Search ................. 365/185, 184, 94, 103,
365/104, 201, 189.06, 189.11, 203, 189.03, 194;
371/21

[56] References Cited

U.S. PATENT DOCUMENTS

| | | | |
|---|---|---|---|
| 4,543,647 | 9/1985 | Yoshida | 365/201 |
| 4,553,225 | 11/1985 | Ohe | 365/201 |
| 4,612,630 | 9/1986 | Rosier | 365/201 |
| 4,737,936 | 4/1988 | Takeuchi | 365/201 X |
| 4,779,272 | 10/1988 | Kohda et al. | 365/185 X |

Primary Examiner—Stuart N. Hecker
Assistant Examiner—Alyssa H. Bowler
Attorney, Agent, or Firm—Sughrue, Mion, Zinn, Macpeak & Seas

[57] ABSTRACT

A semiconductor memory in which each of memory cells includes a memory transistor having a control gate connected to a word line, a floating gate and a drain-source path connected to a bit line, is disclosed. In a data programming operation mode, a programming voltage is applied via the word and bit lines to the control gate and the drain-source path of the memory transistor to inject carriers into the floating gate thereof. In order to detect whether or not the memory transistor is well programmed, a program verifying operation is carried out successively. To this end, the bit line is discharged to the low level and the word line is then supplied with a reading-out voltage. If the data programming is insufficient, the memory transistor is turned ON by the reading-out voltage, so that the bit line is held at a level near the low level. On the other hand, in case where the memory transistor is well programmed, it is not turned ON by the reading-out, so that the bit line is charged.

8 Claims, 4 Drawing Sheets

PROGRAMMABLE READ ONLY MEMORY WITH MEANS FOR DISCHARGING BIT LINE BEFORE PROGRAM VERIFYING OPERATION

BACKGROUND OF THE INVENTION

The present invention relates to a semiconductor memory wherein each of memory cells includes an insulated gate field effect transistor having a floating gate, and more particularly to such a memory having a function of verifying that a memory cell supplied with a programming voltage is actually programmed.

A semiconductor memory employing an insulated gate field effect transistor having a floating gate as a memory transistor is widely used as a programmable read only memory (PROM). The memory transistor further has a control gate connected to a word line and a drain-source path connected to a bit line. In a data programming (write) operation, a programming high voltage is applied to the control gate and the drain-source path to inject carriers into the floating gate, so that the threshold voltage of the memory transistor is shifted from a first, low value to a second, high value. The memory transistor has the first, low threshold voltage, if no carrier is injected into the floating gate or if the carriers are released from the floating gate.

Since the carrier injection depends on the value of the programming voltage and/or a time period for applying the programming voltage and further on electrical characteristics of the memory transistor, it is required to verify that the memory transistor applied with the programming voltage is actually programmed. For this purpose, the PROM is brought into a data read operation immediately after the data programming operation without changing address data to read out data of the memory transistor which has been supplied with the programming voltage. This operation mode is called "program verifying operation". In the program verifying operation, the control gate of the memory transistor is supplied with a reading-out voltage that is larger than the first threshold voltage but smaller than the second threshold voltage. When the memory transistor is actually programmed, therefore, it is not turned ON by the reading-out voltage, so that no current flows through the drain-source path of the memory transistor. The bit line is thereby held at a high level and a data read-out circuit coupled to the bit line produces output data of "1", for example. On the other hand, in case where the memory transistor is failed to be programmed, it is turned ON by the reading-out voltage. In this case, if the threshold voltage of the memory transistor is shifted to a third value that is slightly smaller than the reading-out voltage, the conductive resistant of the memory transistor is considerably large, so that only a small current flows through the drain-source path thereof. The potential level of the bit line is thereby lowered with a large time constant. For this reason, the data read-out circuit produces erroneously the output data of "1" during the program verifying operation period. Thus, there occurs error in judgement.

SUMMARY OF THE INVENTION

Therefore, an object of the present invention is to provide a semiconductor memory including an improved circuit arrangement for a verifying operation.

Another object of the present invention is to provide a semiconductor memory which makes possible to surely verify that a memory transistor supplied with a programming voltage is actually programmed.

A semiconductor memory according to the present invention comprises a plurality of word lines, a plurality of bit lines intersecting the respective word lines, a plurality of memory transistors each disposed at a different one of the intersections of the word and bit lines, means responsive to a set of address signals for selecting one of the word lines and one of the bit lines, means responsive to a program control signal for supplying a programming voltage to the selected word line and the selected bit line, means responsive to a disappearance of the program control signal for discharging the selected bit line, means for supplying a reading-out voltage to the selected word line after the selected bit line is discharged, and a data read-out circuit coupled to the selected bit line for producing output data.

The present invention is characterized by provision of means for discharging the selected bit line before a program verifying operation starts. The selected bit line is thereby changed to a low level. Accordingly, even if the programmed memory transistor has a considerably large conductive resistance through insufficient programming, the data read-out circuit produces output data of "0", for example. In that case, the transistor is again programmed by additional data programming operation. On the other hand, when the memory transistor is well programmed, no current flows through the drain-source path thereof. The selected bit line is charged by the data read-out circuit to produce output data of "1".

In a preferred embodiment of the present invention, the memory transistor discharges the selected bit line before the program verifying operation starts. For this purpose, the selected word line is maintained at the programming voltage during a predetermined period of time from the disappearance of the program control signal.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE PREFERRED EMBODIMENTS

Figure 1:
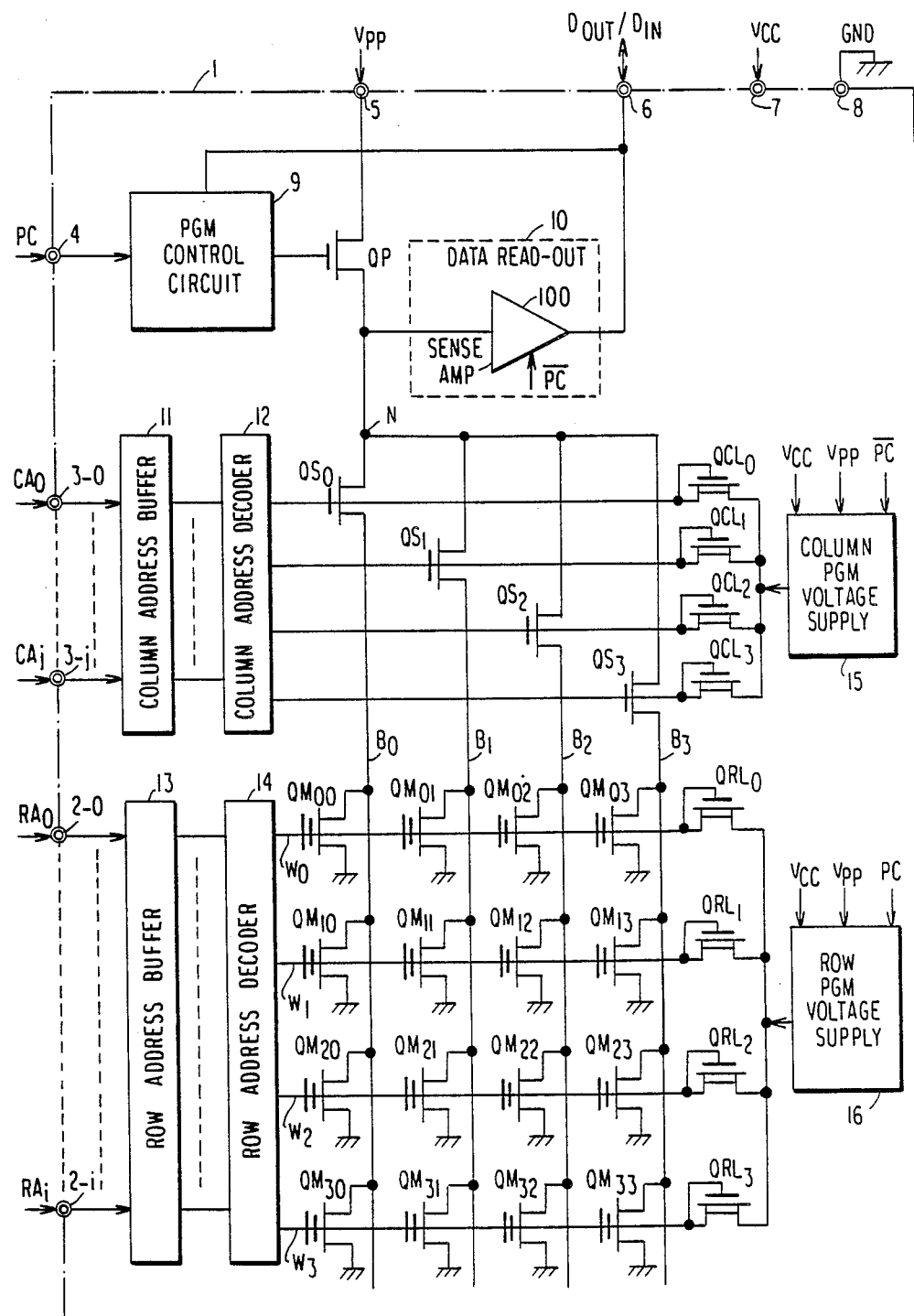
FIG. 1 is a circuit diagram representative of a semiconductor memory according to an embodiment of the present invention.

Referring to FIG. 1, a semiconductor memory 1 according to an embodiment of the present invention includes a plurality of memory transistors QM. Sixteen memory transistors $QM_{00}$ to $QM_{33}$ are shown in this embodiment and arranged in a matrix form. Each of the memory transistors QM has a control gate, a floating gate and a drain-source path. The control gates of the memory transistors arranged in the same row, $QM_{00}$ to $QM_{03}$, $QM_{10}$ to $QM_{13}$, $QM_{20}$ to $QM_{23}$ and $QM_{30}$ to $QM_{33}$, are connected in common to respective word lines $W_0$ to $W_3$ which are in turn connected to a row programming voltage supply circuit 16 via load transistors $QRL_0$ to $QRL_3$ of a depletion type, respectively. The word lines $W_0$ to $W_3$ are further connected to a row address decoder 14. The drains of the memory transistors arranged in the same column, $QM_{00}$ to $QM_{30}$, $QM_{01}$ to $QM_{31}$, $QM_{02}$ to $QM_{32}$ and $QM_{03}$ to $QM_{33}$, are connected in common to respective bit lines $B_0$ to $B_3$ which are in turn connected to a circuit node N via switching transistors $QS_0$ to $QS_3$, respectively. The sources of all the memory transistors $QM_{00}$ to $QM_{33}$ are connected to a ground terminal 8. The gates of the switching transistors $QS_0$ to $QS_3$ are connected to a column address decoder 13 and further to a column programming voltage supply circuit 15 via load transistors $QCL_0$ to $QCL_3$ of a depletion type, respectively. The row programming voltage supply circuit 16 is applied with a power voltage Vcc via a terminal 7, a programming voltage Vpp via a terminal 6 and a program control signal PC via a terminal 4. The circuit 15 is applied with the power voltage Vcc, the programming voltage Vpp and an inverted signal $\overline{PC}$ of the program control signal PC.

Row address signals RA0 to RAi are supplied respectively to row address terminals 2-0 to 2-i and then introduced into a row address buffer 13. Column address signals CA0 to CAj are supplied respectively to column address terminals 3-0 to 3-j and then introduced into a column address buffer 11. A row address decoder 14 responds to outputs of the buffer 13 and selects one of the word lines $W_0$ to $W_3$. A column address decoder 12 responds to outputs of the buffer 11 and turns ON one of the switching transistors $QS_0$ to $QS_3$ to select one of the bit lines $B_0$ to $B_3$. Thus, one of the memory transistors $QM_{00}$ to $QM_{33}$ is designated in response to a set of address signals RA0 to RAi and CA0 to CAj.

In a data programming (or writing) operation, a high level program control signal PC is supplied to the terminal 9 and the programming voltage Vpp having a predetermined high value of about 12.5 V is supplied to the terminal 5. At this time, a terminal 6 is used as a data input terminal supplied with input data $D_{IN}$. When the input data is "1", a program control circuit 9 turns a programming transistor QP ON to transfer the programming voltage Vpp to the node N. On the other hand, the input data $D_{IN}$ of "0" causes the circuit 9 to turn the transistor QP OFF.

In a program verifying operation, the program control signal PC is changed to the low level and the programming voltage Vpp is held at the predetermined high value. The program control circuit 9 maintains the transistor QP in a nonconductive state irrespective of the data at the terminal 6. A data read-out circuit 10 is then activated so that a sense amplifier 100 detects the level of the node N to produce output data $D_{OUT}$ at the terminal 6.

In a data reading-out operation, a low level program control signal PC is supplied to the terminal 4 and the power voltage Vcc of 5 V is supplied to the terminal 5 in place of the programming voltage Vpp. The programming control circuit 9 is thereby inactivated and the data readout circuit 10 is activated.

Figure 2:
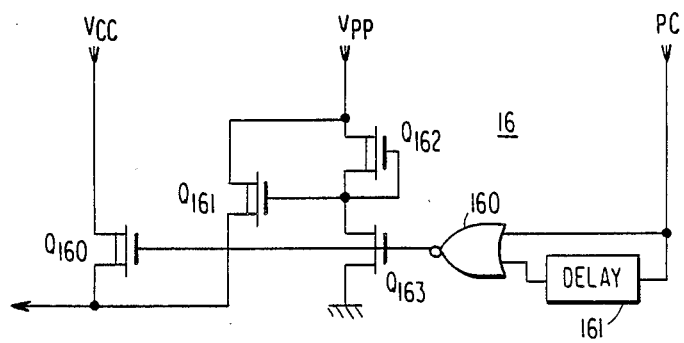
FIG. 2 is a circuit diagram representative of one example of a row programming voltage supply circuit shown in FIG. 1.
Figure 3:
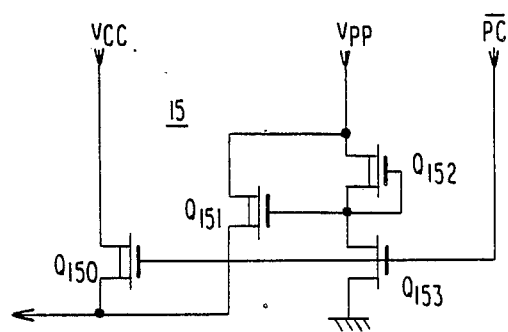
FIG. 3 is a circuit diagram representative of a column programming voltage supply circuit shown in FIG. 1.

Referring to FIG. 2, a row programming voltage supply circuit 16 includes three depletion type transistors $Q_{160}$, $Q_{161}$ and $Q_{162}$, one enhancement type transistor $Q_{163}$, a NOR gate 160 and a delay circuit 161 which are connected as shown. Referring to FIG. 3, a column programming voltage supply circuit 15 includes three depletion type transistors $Q_{150}$ to $Q_{152}$ and one enhancement type transistor $Q_{153}$ which are connected as shown. In FIGS. 1 to 3, all the transistors are of an N-channel type.

Figure 4:
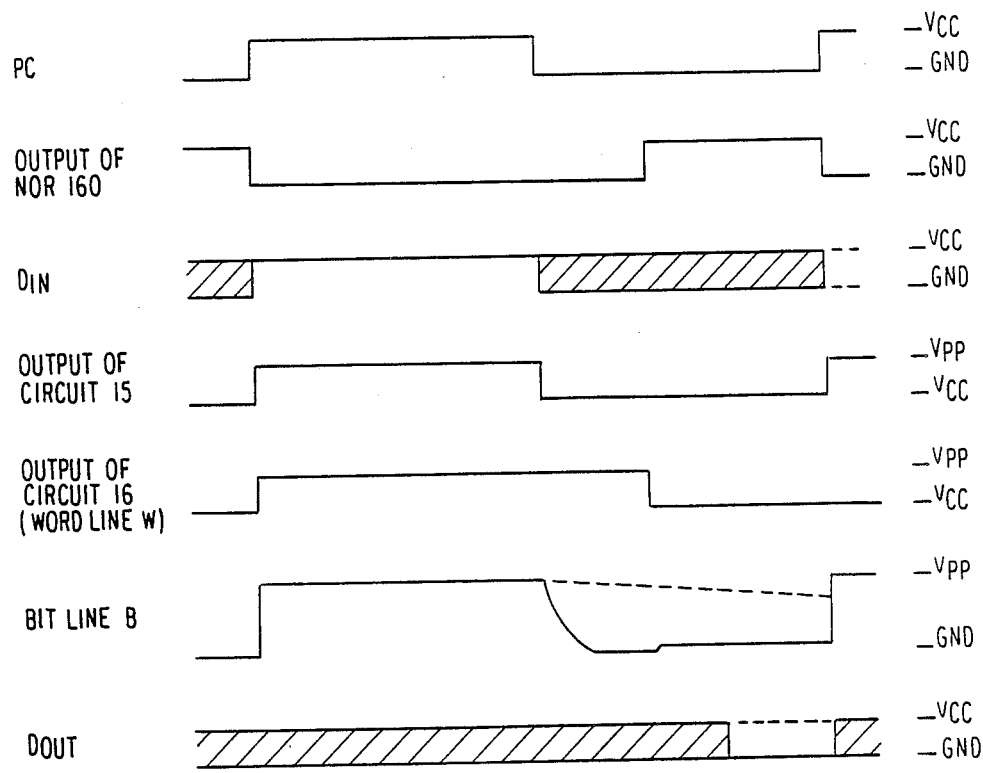
FIG. 4 is a timing chart representative of a data programming operation and a program verifying operation of the semiconductor memory shown in FIG. 1.

The data programming operation and program verifying operation will be described below with reference to FIGS. 1 to 4. Since the high level program control signal PC is supplied to the terminal 4, the NOR gate 160 produces the low level output, as shown in FIG. 4. The transistors $Q_{160}$ and $Q_{163}$ are thereby turned OFF and the transistors $Q_{161}$ and $Q_{162}$ are turned ON. As a result, the circuit 16 supplies the programming voltage Vpp to the respective one ends of the load transistors $QRL_0$ to $QRL_3$. Since the inverted program control signal $\overline{PC}$ takes the low level, the transistors $Q_{150}$ and $Q_{153}$ are turned OFF and the transistors $Q_{151}$ and $Q_{152}$ are turned ON. Consequently, the circuit 15 supplies the programming voltage Vpp to the respective one ends of load transistors $QCL_0$ to $QCL_3$. Assuming that the word line $W_0$ is selected in response to the valid row address signals $RA_0$ to $RA_i$ and the bit line $B_0$ is selected in response to the valid column address signals $CA_0$ to $CA_j$, the row address decoder 14 disconnects the word line $W_0$ from the ground point and connects the remaining non-selected word lines $W_1$ to $W_3$ to the ground point. Similarly, the column address decoder 12 disconnects the gate of the switching transistor $QS_0$ from the ground point and connects the gates of the remaining switching transistors $QS_1$ to $QS_3$ to the ground point. As a result, the selected word line $W_0$ is raised up to the programming voltage Vpp and the transistor $QS_0$ is turned ON by the programming voltage Vpp applied to the gate thereof. Since the input data of "1" is supplied to the terminal 6, the program control circuit 9 turns the transistors QP ON to supply the programming voltage Vpp to the selected bit line $B_0$. Thus, the memory transistor $QM_{00}$ is designated and the selected word and bit lines $W_0$ and $B_0$ are supplied with the programming voltage Vpp, as shown in FIG. 4. Since the programming voltage Vpp is applied to the control gate and the drain-source path of the designated memory transistor $QM_{00}$, electrons as carriers are injected and trapped into the floating gate thereof. If the designated memory transistor $QM_{00}$ is well programmed, the threshold voltage thereof is shifted from a first value, typically 2 V, to a second value, typically 10 V.

In order to verify that the designated memory transistor $QM_{00}$ is well programmed, a program verifying operation is carried out successively. In this program verifying operation, the row and column address signals $RA_0$—$RA_i$ and $CA_0$—$CA_j$ are not changed and the programming voltage Vpp is held at the predetermined high voltage, 12.5 V. However, the program control signal PC is changed to the low level, as shown in FIG. 4. The program control circuit 9 turns the transistor QP OFF. Since the inverted program control signal $\overline{PC}$ takes the high level, the transistors $Q_{150}$ and $Q_{153}$ are turned ON and the transistor $Q_{151}$ is turned OFF. The power voltage Vcc of 5 V is thereby supplied to the load transistors $QCL_1$ to $QCL_3$. On the other hand, since the delay circuit 161 delays the low level program control signal PC to be supplied to the NOR gate 160, the output of the NOR gate 160 is maintained at the low level during a predetermined period of time which is determined by a delay time of the delay circuit 161, as shown in FIG. 4. Accordingly, the output of the circuit 16, i.e. the selected word line $W_0$, is held at the programming voltage Vpp during this period, as shown in FIG. 4. Since the programming voltage Vpp is larger than the second threshold level (10 V) of the well programmed memory transistor QM, the memory transistor $QM_{00}$ is maintained in a conductive state to discharge the bit line $B_0$. Thus, the bit line $B_0$ is discharged to the low level before reading-out data of the memory transistor $QM_{00}$.

Since the delay circuit 161 thereafter supplies the low level to the NOR gate 160, the output of the NOR gate 160 changes to the low level and the circuit 16 produces the power voltage Vcc, as shown in FIG. 4. The selected word line $W_0$ is thereby supplied with the power voltage Vcc as a reading-out voltage. Assuming that the designated memory transistor $QM_{00}$ has been failed in well programming, the threshold voltage thereof is not shifted to the second value (10 V), but to a third value, 4 V for example, that is slightly smaller than the reading-out voltage (the power voltage Vcc). The memory transistor $QM_{00}$ is thereby turned ON, but the conductive resistance thereof is considerably large. Only a small current flows through the drain-source path of the transistor $QM_{00}$. However, the bit line $B_0$ has been discharged before data-reading, and therefore the bit line $B_0$ maintaines a level near the ground voltage, as shown in FIG. 4. The sense amplifier 100, which is activated by the inverted program control signal $\overline{PC}$, detects the potential level of the selected bit line $B_0$ through the switching transistor $QS_0$ and produces the output data $D_{OUT}$ of "0", as shown in FIG. 4. By checking the output data $D_{OUT}$, it is judged that the memory transistor $QM_{00}$ is not well programmed. In response to this, the data programming is repeated to the memory transistor $QM_{00}$, so that the threshold voltage thereof is shifted to the second value.

If the bit line $B_0$ is not discharged before the verifying operation, i.e. if the circuit 16 produces the power voltage Vcc in synchronism with the changing point of the program control signal PC, the bit line $B_0$ is discharged from the level of the programming voltage Vpp by a small current flowing through the drain-source path of the memory transistor $QM_{00}$. As a result, the level of the bit line $B_0$ is lowered at a very small rate and the sense amplifier 100 produces erroneously the data $D_{OUT}$ of "1", as shown by dotted lines in FIG. 4. Thus, there occurs a misjudgement that the memory transistor $QM_{00}$ has been well programmed.

In the above-mentioned verifying operation, when the threshold voltage of the memory transistor $QM_{00}$ is shifted to the second value, the transistor $QM_{00}$ is not turned ON by the reading-out voltage. No currents flows through the memory transistor $QM_{00}$ via the bit line $B_0$. The bit line $B_0$ is thereby charged up by the sense amplifier 100 and the output data $D_{OUT}$ of "1" is produced.

When the data programming and program verifying operations complete with respect to the memory transistor $QM_{00}$, new row and column address signals $RA_0$—$RA_i$ and $CA_0$—$CA_j$ are supplied to designate another memory transistor, and the data programming and verifying operations are carried out for the newly designated memory transistor.

Figure 5:
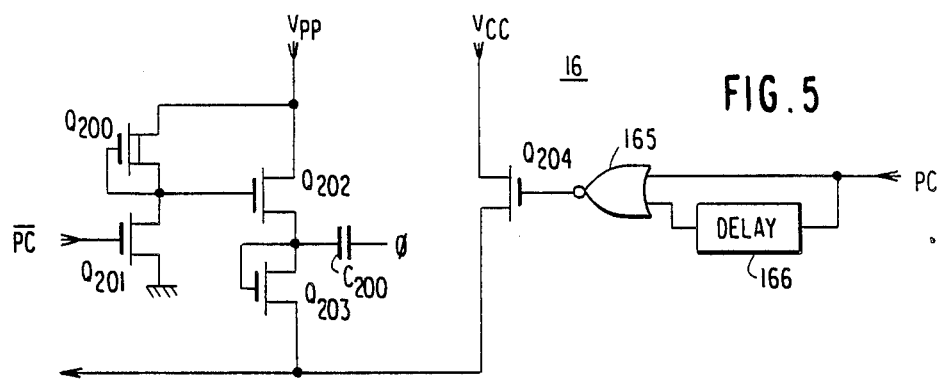
FIG. 5 is a circuit diagram representative of another example of the row programming voltage circuit shown in FIG. 1.

Referring to FIG. 5, another example of the row programming voltage supply circuit 16 includes one depletion type transistor $Q_{200}$, four enhancement type transistors $Q_{201}$ to $Q_{204}$, a capacitor $C_{200}$, a NOR gate 165 and a delay circuit 166 which are connected as shown. A clock signal $\phi$ is supplied to one end of the capacitor $C_{200}$. In the data programming operation wherein the program control signal PC takes the high level, the transistors $Q_{201}$ and $Q_{204}$ are turned OFF and the transistors $Q_{202}$ and $Q_{203}$ are turned ON. A charge pumping circuit composed of the transistors $Q_{202}$ and $Q_{203}$ and the capacitor $C_{200}$ operates in response to the clock signal $\phi$, so that the circuit 16 produces the boosted level of the programming voltage Vpp. When the program control signal PC changes to the low level to carry out the program verifying operation, the transistor $Q_{201}$ is turned ON to inactivate the charge pumping circuit. By the delay circuit 166, the transistor $Q_{204}$ is maintained in the nonconductive state during a predetermined time, so that the boosted level of the programming voltage Vpp is derived from the output of the circuit 16. Since the boosted level make small the conductive resistance of the memory transistor QM, the selected bit line B is discharged rapidly to the low level. The delay circuit 166 thereafter supplies the low level to the NOR gate 165, the output of the NOR gate 165 changes to the high level to turn the transistor $Q_{204}$ ON. As a result, the circuit 16 produces the power voltage Vcc as a reading-out voltage.

The present invention is not limited to the above embodiments but may be changed and modified without departing from the scope and spirit of the present invention. For example, the programming voltage Vpp can be obtained internally by boosting the power voltage Vcc. The output voltage from the column programming voltage supply circuit 15 can be changed in the same timing as the output voltage from the row programming supply circuit 16. In this case, the circuit 16 can be used in common for the circuit 15.

What is claimed is:

1. A semiconductor memory comprising a plurality of word lines, a plurality of bit lines intersecting said word lines, a plurality of programmable memory cells coupled to said word lines and said bit lines, a first terminal receiving a first voltage, a second terminal receiving a second voltage larger than said first voltage, a third terminal receiving a control signal assuming one of first and second levels, a first row selector circuit for selectively setting one of said word lines approximately at said first voltage when enabled, a second row selection circuit for selectively applying said second voltage to one of said word lines when enabled, a column program circuit for selectively applying said second voltage to at least one of said bit lines when enabled, a first control circuit for enabling said column program circuit in response to said first level of said control signal, and a second control circuit for enabling said first row selection circuit and disenabling said second row selection circuit after a predetermined period of time elapses from a change of said control signal from said first level to said second level and enabling said second row selection circuit and disenabling said first row selection circuit during a first period when said control signal assumes said first level and said predetermined period following said first period.

2. The semiconductor memory as claimed in claim 1, wherein each of said programmable memory cells includes a field effect transistor having a control gate connected to one of said word lines, a floating gate and a drain-source path connected between one of said bit lines and a reference potential point.

3. A semiconductor memory as claimed in claim 1, wherein said second control circuit includes a delay circuit receiving said control signal, said predetermined period of time being determined by a delay time of said delay circuit.

4. A semiconductor memory comprising a plurality of word lines, a plurality of bit lines, a plurality of memory transistors, each of said memory transistors having a control gate coupled to one of said word lines, a floating gate and a drain-source path connected between one of said bit lines and a reference potential point, a first terminal receiving a first voltage, a second terminal receiving a second voltage having a larger value than said first voltage, a third terminal receiving a control signal assuming one of first and second levels, all of said memory transistors being rendered conductive irrespective of data stored therein when their control gates are supplied with said second voltage, said memory transistors being selectively rendered conductive and nonconductive according to data stored therein when their control gates are supplied with said first voltage, first means coupled between said first terminal and said word lines for operatively transferring said first voltage to one of said word lines when enabled, second means coupled between said second terminal and said word lines for operatively transferring said second voltage to one of said word lines when enabled, third means coupled to said third terminal for enabling said second means in response to said first level, and fourth means coupled to said third terminal and responsive to a change of said control signal from said first level to said second level for enabling said first means to transfer said first voltage to one of said word lines after a predetermined period of time elapses from said change.

5. The semiconductor memory according to claim 4, further comprising fifth means coupled between said second terminal and said bit lines for operatively transferring said second voltage to at least one of said bit lines in response to said first level of said control signal.

6. The semiconductor memory according to claim 4, wherein said fourth means includes delay circuit means for delaying said change, said predetermined period of time being determined by a delay time of said delay circuit means.

7. A semiconductor memory comprising a memory transistor having a control gate, a floating gate and a drain-source path, a first terminal supplied with a first voltage, a second terminal supplied with a second voltage that is larger than said first voltage, a third terminal supplied with a control signal changing between first and second logic levels, first means coupled between said first terminal and said control gate of said memory transistor for operatively transferring said first voltage to said control gate, second means coupled between said second terminal and said control gate of said memory transistor for operatively transferring said second voltage to said control gate, third means coupled to said third terminal and responsive to said first logic level of said control signal for instructing said second means to transfer said second voltage to said control gate, and fourth means coupled to said third terminal and responsive to a change of said control signal from said first logic level to said second logic level for instructing said first means to transfer said first voltage to said control gate after a predetermined period of time elapses from said change.

8. The semiconductor memory as claimed in claim 7, wherein said fourth means includes delay circuit means for delaying said change, said predetermined period of time being determined by a delay time of said delay circuit means.

* * * * *

UNITED STATES PATENT AND TRADEMARK OFFICE
CERTIFICATE OF CORRECTION

PATENT NO. : 4,937,787
DATED : June 26, 1990
INVENTOR(S) : Hiroyuki KOBATAKE

It is certified that error appears in the above-identified patent and that said Letters Patent is hereby corrected as shown below:

Col. 3, line 27, delete "RAO" and insert --$RA_0$--;

Col. 3, line 30, delete "CAO" and insert --$CA_0$--;

Col. 3, line 39, delete "RAO" and "CAO" and insert --$RA_0$-- and --$CA_0$--.

Signed and Sealed this

Twenty-ninth Day of October, 1991

*Attest:*

HARRY F. MANBECK, JR.

*Attesting Officer*     *Commissioner of Patents and Trademarks*